(12) United States Patent
Mayer et al.

(10) Patent No.: US 8,475,246 B2
(45) Date of Patent: Jul. 2, 2013

(54) AIRFLOW DAMPER THAT ACCOMMODATES A DEVICE

(75) Inventors: Dave Mayer, Fort Collins, CO (US); Paul Rubens, Allen, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1315 days.

(21) Appl. No.: 12/237,946

(22) Filed: Sep. 25, 2008

(65) Prior Publication Data

US 2010/0073868 A1   Mar. 25, 2010

(51) Int. Cl.
*H05K 5/00* (2006.01)

(52) U.S. Cl.
USPC .......................................... 454/184

(58) Field of Classification Search
USPC .......................................... 454/184
See application file for complete search history.

(56) References Cited

U.S. PATENT DOCUMENTS

| 7,589,973 | B2* | 9/2009 | Ong et al. ................ 361/719 |
| 2008/0026625 | A1* | 1/2008 | Carver et al. ............ 439/310 |
| 2009/0019680 | A1* | 1/2009 | Krohn ..................... 29/272 |
| 2009/0027852 | A1* | 1/2009 | Roesner et al. .......... 361/690 |
| 2009/0233537 | A1* | 9/2009 | Kao et al. ................ 454/184 |

* cited by examiner

*Primary Examiner* — Steven B McAllister
*Assistant Examiner* — Jamil Decker

(57) ABSTRACT

An airflow damper is provided, the airflow damper includes a resilient body having a fixed end and a free end. In a default state, the free end extends to restrict airflow. In a device accommodation state, the free end flattens to accommodate a device.

6 Claims, 4 Drawing Sheets

AIRFLOW DAMPER THAT ACCOMMODATES A DEVICE

CROSS REFERENCE TO RELATED APPLICATIONS

This Application claims the benefit of U.S. Provisional Application Ser. No. 61/048,740, filed Apr. 29, 2008, titled "Airflow Damper That Accommodates A Device" which is hereby incorporated by reference herein as if reproduced in full below.

BACKGROUND

In some modular electrical systems (e.g., a server rack or power supply rack), providing sufficient airflow for the modular components is important to prevent overheating or other temperature-related issues. In such systems, there may be situations when one or more modular components are removed for repairs or upgrades. Upon removal of a modular component, the airflow balance of the system is disrupted because the air pulled through the system will seek the path of least resistance and will rush through an unrestricted airflow path created by removal of the modular component. In some situations, an unrestricted airflow path causes various components of the system to be starved of airflow, which may result in overheating or other reliability issues.

BRIEF DESCRIPTION OF THE DRAWINGS

For a detailed description of exemplary embodiments of the invention, reference will now be made to the accompanying drawings in which:

FIG. 5 illustrates the modular electrical system of FIG. 1 with airflow dampers installed in accordance with embodiments of the disclosure.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function, in the following discussion and in the claims, the terms "including" and "comprising" are used in an open-ended fashion, and thus should be interpreted to mean "including, but not limited to . . . ." Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled In the art will understand that the following description has broad application, and the discussion of any embodiment is meant only to be exemplary of that embodiment, and not intended to intimate that the scope of the disclosure, including the claims, is limited to that embodiment.

Embodiments are directed to airflow dampers and systems that implement airflow dampers. In at least some embodiments, an airflow damper comprises a resilient body having a fixed end and a free end. In a default state, the free end extends Into an airflow cavity to restrict airflow. In a device accommodation state, the free end Is forcibly flattened along the airflow cavity. Airflow dampers can be implemented in modular electrical system having slots that accommodate modular components. By positioning an airflow damper within a slot, unrestricted airflow through the slot is prevented when a modular component is removed. The airflow damper maintains its default position unless forcibly flattened (e.g., by insertion of a modular component). In some embodiments, the default position emulates or approximates the same airflow that exists when the modular component is installed in a slot. The airflow damper solution described herein provides several advantages including a low profile (e.g., less than a millimeter) that doesn't interfere with system design, inexpensive materials, and high reliability.

Figure 1:
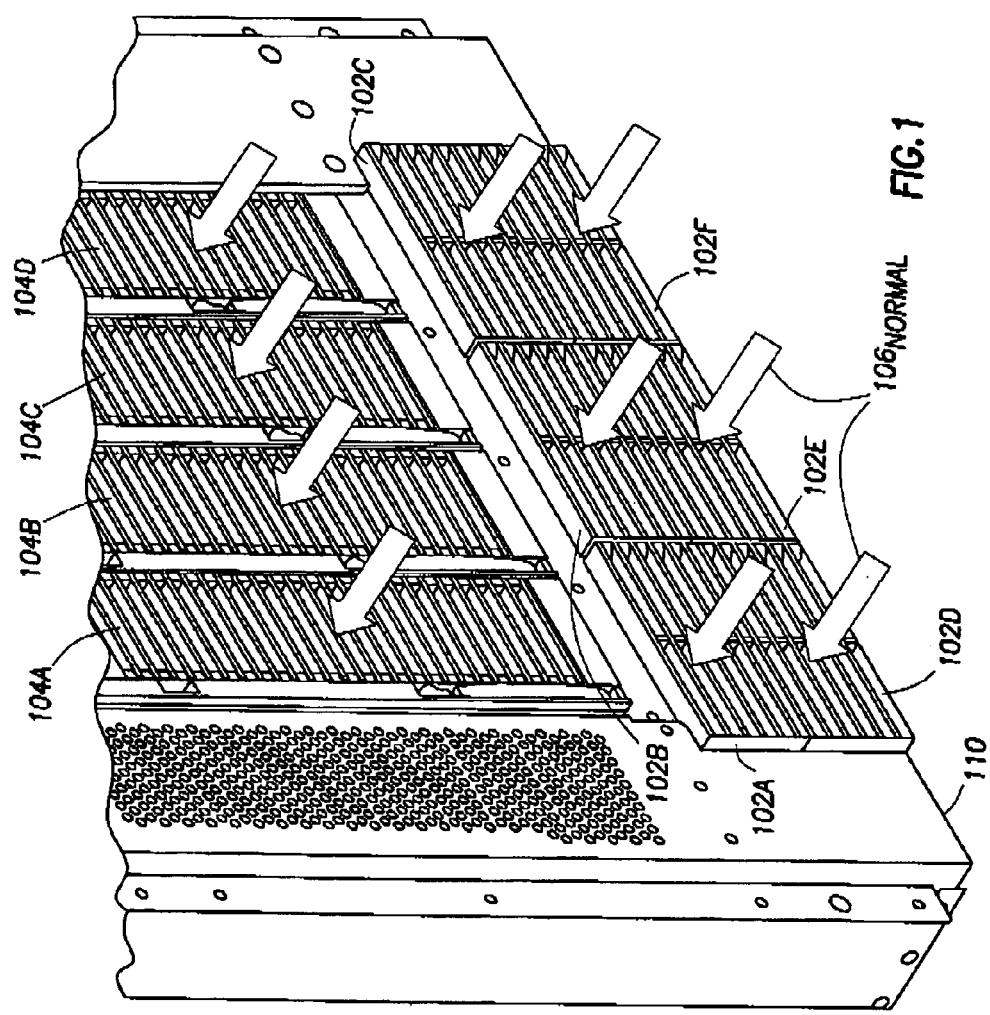
FIG. 1 illustrates a modular electrical system in accordance with embodiments of the disclosure.

FIG. 1 illustrates a modular electrical system 100 in accordance with embodiments. In FIG. 1, the modular electrical system 100 comprises a chassis 110 that houses a plurality of power supply units 102A-102F and a plurality of processor boards 104A-104O. As used herein, the term "modular electrical system" refers to a system with removable or swappable components. The quantity and type of removable components could vary for different embodiments.

In at least some embodiments, the modular electrical system 100 of FIG. 1 represents a power supply rack and/or a server rack. As understood by those of skill in the art, the modular electrical system 100 could represent other known or later developed systems that rely on airflow 106 (represented by the block arrows) to prevent overheating or other temperature-related issues. The airflow 106 is forced into the modular electrical system 100 based on techniques such as suction (e.g., fans) and/or external airflow control.

Figure 2:
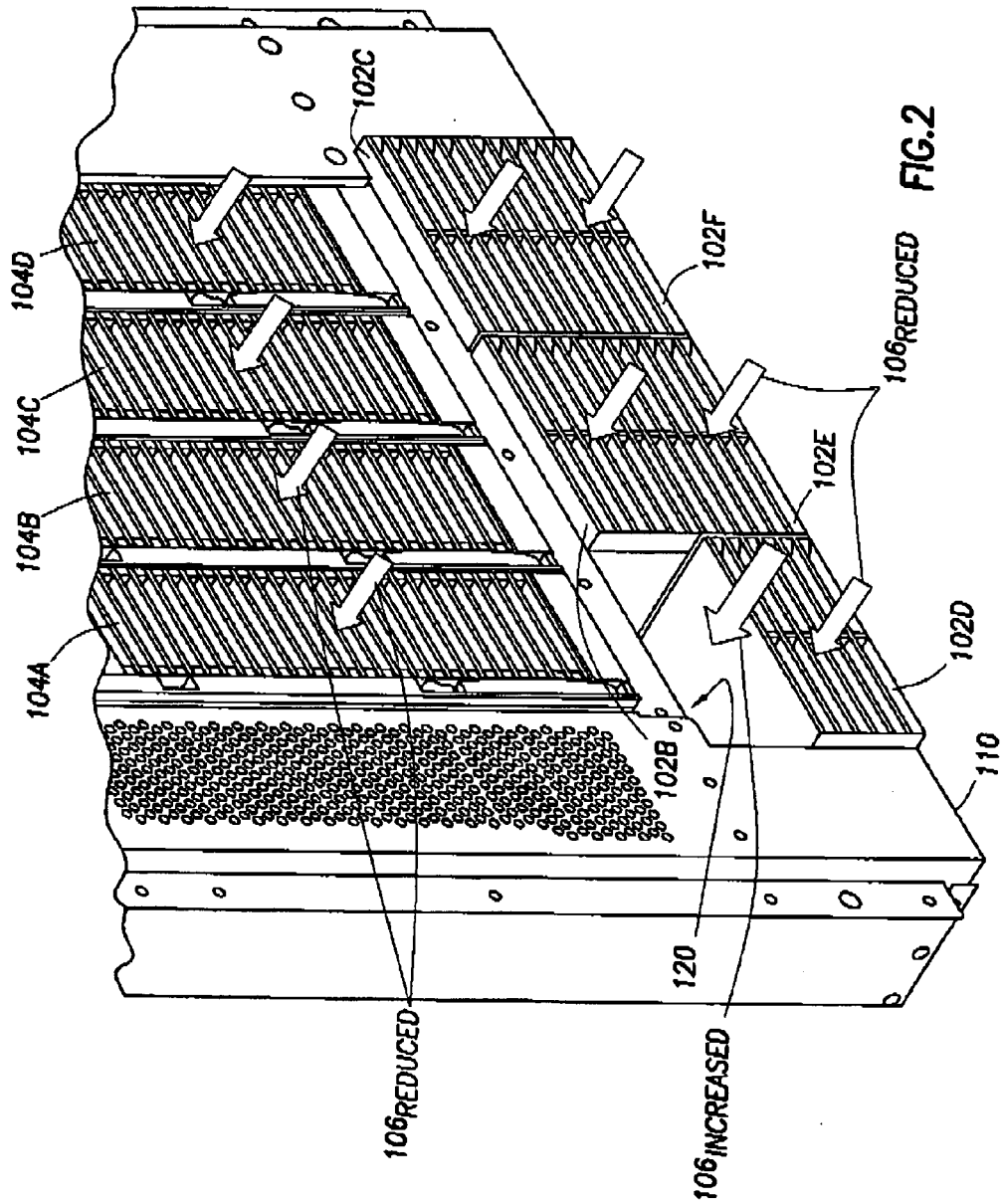
FIG. 2 illustrates the modular electrical system of FIG. 1 with a disrupted airflow In accordance with embodiments of the disclosure.

FIG. 2 illustrates the modular electrical system of FIG. 1 with a disrupted airflow in accordance with embodiments of the disclosure. In FIG. 2, the power supply unit 102A has been removed, which creates an unrestricted air cavity 120 with increased airflow $106_I$. Consequently, the power supply units 102B-102F and the processor boards 104A-104D receive a reduced airflow $106_R$. In other words, the balance of airflow is disrupted because of the unrestricted air cavity 120. With the reduced airflow $106_R$, the power supplies 102B-102F and the processor boards 104A-104D are more likely to overheat or suffer other reliability Issues.

Figure 3:
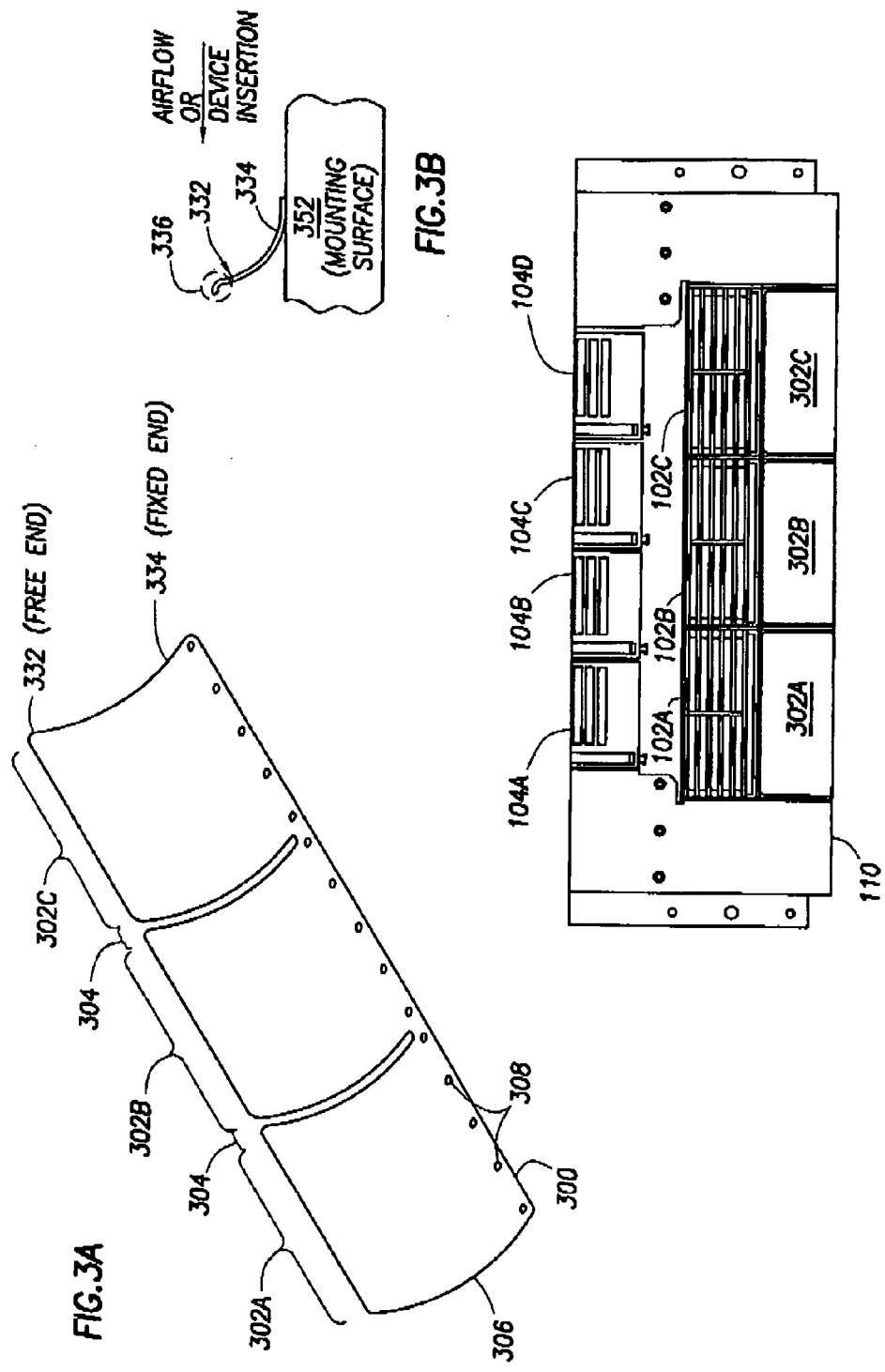
FIG. 3A illustrates an airflow damper in accordance with embodiments of the disclosure.
FIG. 3B Illustrates a side view profile of an airflow damper in accordance with embodiments of the disclosure.

FIG. 3A Illustrates an airflow damper 300 in accordance with embodiments of the disclosure. The airflow damper 300 is constructed of a resilient material such as stainless steel or polycarbonate. As used herein, the term "resilient material" refers to a material that bends when more than a threshold amount of force is applied, but returns to its original shape once the threshold amount of force is removed. The resilient materials described herein should not significantly bend due to airflow (i.e., the force of airflow is less than the threshold amount of force), but should bend when a device is pushed against the resilient material (i.e., the force of pushing the device is greater than the threshold amount of force). Although not required, the airflow damper 300 may be constructed as a one-piece body. Such construction is believed to offer reliability and cost advantages.

As shown in FIG. 3A, the airflow damper 300 has three sections 302A-302C divided by gaps 304. In different embodiments, the number of sections may Increase or decrease. In FIG. 3A, the shape of the sections 302A-302C is rectangular, although other shapes are possible. The purpose of each section is to emulate an airflow associated with a predetermined modular component, in other words, each section 302A-302C does not necessarily block off all airflow and, instead, approximates whatever airflow exists when a predetermined modular component is installed. Further, although the sections 302A-302C shown in FIG. 3A are approximately equal in size and shape, other embodiments could have sections which differ in size, shape, or direction.

Regardless of the quantity, size, and/or shape of the sections, each section has- a free end 332 and a fixed end 334. As shown, the fixed end 334 have may have openings 308 that facilitate attachment of the airflow damper 300 to an object. For example, the openings 308 can be used to rivet or otherwise fasten the airflow damper 300 to a device chassis or to a device's internal structure. In alternative embodiments, openings can be omitted and the airflow damper 300 can be attached to a device using welding techniques and/or adhesives. Regardless of how the airflow damper 300 is attached to a device, the fixed end 334 becomes immovable with respect to the device. In contrast, the free end 332 is movable and either blocks airflow or flattens to accommodate a modular component, which may be inserted Into or removed from a device.

In at least some embodiments, the airflow damper 300 has a default state and a device accommodation state. In the default state, the free end 332 extends to restrict airflow. In the device accommodation state, the free end 332 flattens to accommodate a device. In at least some embodiments, the airflow damper 300 maintains a predetermined curvature 308 between the fixed end 334 and the free end 332, while in the default state. In the device accommodation state, the curvature 308 is substantially flattened to accommodate the device. Subsequently, upon removal of the device, the airflow damper 300 automatically returns to the default state due to the resilient material from which the airflow damper 300 is constructed. The curvature 308 can vary for different embodiments, but should facilitate insertion and removal of a device. In some embodiments, a curvature (or lack thereof) that provides high-durability and effective airflow damping for the airflow damper 300 can he determined based on calculations or stress testing as is known in the art.

In at least some embodiments, the airflow damper 300 functions as an electromagnetic interference (EMI) shield in an electronic device. In such case, considerations such as the material, the thickness, and the placement of the airflow damper 300 within a system are relevant considerations.

FIG. 38 illustrates a side view profile 350 of an airflow damper in accordance with embodiments. As shown in FIG. 3B, the fixed end 334 is shown to be substantially flat with respect to a mounting surface 352. Meanwhile, the free end 332 is angled to substantially block an airflow and to flatten when a device is pushed into the airflow damper. In at least some embodiments, the free end 332 comprises a convex portion 336 that helps prevent the device from catching on the airflow damper during insertion or removal of the device.

Additionally or alternatively, the free end 332 may comprises a bumper material that cushions or facilitates a device's movement along the free end 332 during insertion or removal of the device. For example, the bumper material may comprise a plastic mold or coating.

Figure 4:
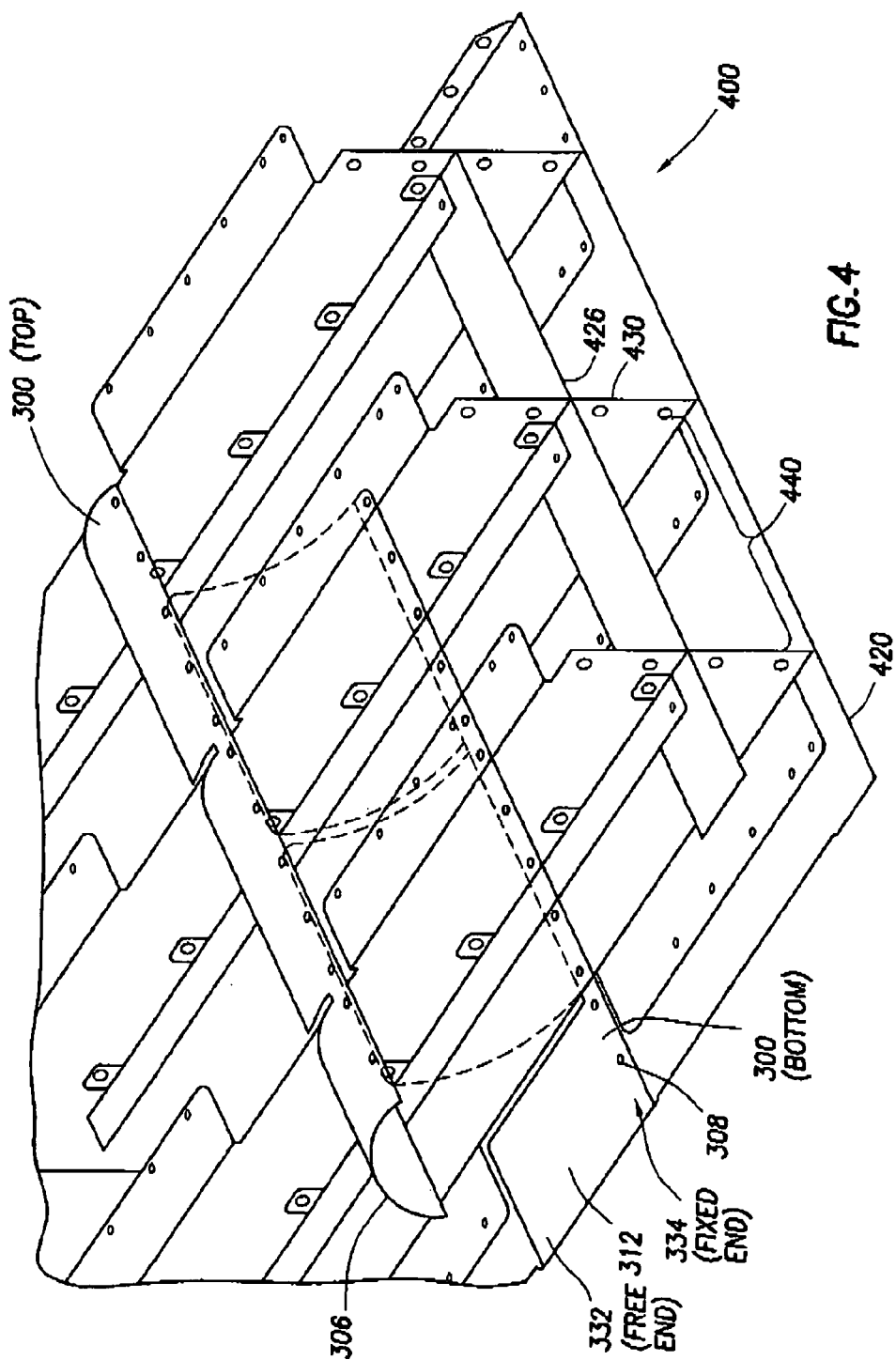
FIG. 4 illustrates an internal frame of a modular electrical system with airflow dampers in accordance with embodiments of the disclosure.

FIG. 4 illustrates an internal frame 400 of a modular electrical system with airflow dampers in accordance with embodiments of the disclosure. In FIG. 4, the chassis and/or internal parts of the system have been removed for convenience in describing embodiments. As shown, the frame 400 comprises an assembly of vertical sections 430 and horizontal sections 420 that form slots 440 to accommodate modular components such as power supply, servers, or other removable components, in at least some embodiments, each slot 440 is associated with a separate airflow cavity. Alternatively, slots 440 may physically support a modular component in a desired position without completely enclosing the modular component. Thus, an airflow cavity may correspond to one slot or multiple slots. Regardless of whether an airflow cavity corresponds to one slot or multiple slots, insertion or removal of modular components would undesirably change the airflow.

To maintain a desired airflow, two airflow dampers $300_{bottom}$ and $300_{top}$ are attached to the frame 400. In FIG. 4, the fixed end 334 of the airflow damper $300_{bottom}$ to the bottom or to another horizontal section 420 of the frame 400. For example, the openings 308 can be used to rivet or otherwise fasten the fixed end 334 of the airflow damper $300_{bottom}$ to the bottom (or other horizontal section) of the frame 400. Meanwhile, the free end 332 of each section of the airflow damper $300_{bottom}$ extends to substantially block airflow through the lower slots 440 of the frame 400 when modular components are not installed in the slots 440. To avoid interference with vertical sections of the frame 400, airflow damper $300_{bottom}$ is positioned so that the gaps 304 line up with the vertical sections 430 of the frame 400. In FIG. 4, the leftmost section of the airflow damper $300_{bottom}$ is shown in a flattened state or device accommodation state that automatically occurs upon insertion of a modular device into the corresponding slot.

In FIG. 4, the fixed end 334 of the airflow damper $300_{top}$ attaches to the top (not shown) of the frame 400. For example, the openings 308 can be used to rivet or otherwise fasten the fixed end 334 of the airflow damper $300_{top}$ to the top or to another horizontal section 420 of the frame 400. Meanwhile, the free end 332 of each section of the airflow damper 300top extends to substantially block airflow through the upper slots 440 of the frame 400 when modular components are not installed in the slots 440. To avoid interference with vertical sections 430 of the frame 400, the gaps 304 between sections of the airflow damper $300_{top}$ line up with the vertical sections 430 of the frame 400.

In alternative embodiments, airflow dampers 300 can be attached to a side section (i.e., vertical sections 430) of the frame 400. As needed, the size of the gaps 304 between sections of an airflow damper 300 can be adjusted for different frame designs. Also, airflow dampers 300 can be designed with or without the gaps 304. As an example, if an airflow damper 300 is available during frame assembly, the airflow damper 300 can include gaps 304 that will correspond with vertical or horizontal sections of a frame. If an airflow damper 300 is not available during frame assembly, the airflow damper 300 can later be added. Depending on the frame design, separate single-section airflow dampers may be easier to Install than a single airflow damper with multiple sections separated by gaps 304.

FIG. 5 illustrates the modular electrical system 100 of FIG. 1 with airflow dampers 300 installed in accordance with embodiments of the disclosure. In FIG. 5, the power supply units 102D-102F have been removed exposing airflow cavities. Because the airflow damper 300 has been installed, the airflow damper sections 302A-302C are able to block or appropriately control airflow through the exposed airflow cavities. The power supply units 102A-102G and the processor boards 104A-104D may also be associated with corresponding airflow dampers or airflow damper sections which have been flattened due to Insertion of these devices Into the system 100. Should one of the power supply units 102A-102C or the processor boards 104A-104D be removed, its corresponding airflow damper or airflow damper section would automatically extend into the exposed airflow cavity to appropriately control airflow for the system 100.

The above discussion is meant to be illustrative of the principles and various embodiments of the present invention. Numerous variations and modifications will become apparent to those skilled in the art once the above disclosure is fully appreciated. If is intended that the following claims be interpreted to embrace all such variations and modifications.

The invention claimed is:

1. A system, comprising:
   a plurality of airflow cavities configured to accommodate a device;
   a frame having a plurality of slots, each slot having two side walls, to hold modular electrical devices, wherein each slot is associated with a separate airflow cavity; and
   an airflow damper comprising a one-piece body having multiple sections, each section being associated with a different slot and positioned within the airflow cavity, wherein the airflow damper substantially blocks the airflow cavity unless flattened by insertion of the device.

2. The system of claim 1 wherein each slot is equipped with an airflow damper that flattens upon insertion of a modular electrical device and that blocks airflow upon removal of a modular electrical device.

3. The system of claim 1 wherein the system comprises a power supply rack.

4. The system of claim 1 wherein the system comprises a server rack.

5. The system of claim 1 wherein the airflow damper comprises a resilient one-piece body having a fixed end attached to a side of the airflow cavity and a free end that extends to restrict airflow unless flattened by insertion of the device.

6. The system of claim 1 wherein the airflow damper comprises a resilient body that maintains a predetermined curvature unless flattened by insertion of the device.

* * * * *